United States Patent
Ichiyama

(10) Patent No.: US 8,659,330 B2
(45) Date of Patent: Feb. 25, 2014

(54) SIGNAL GENERATION APPARATUS AND SIGNAL GENERATION METHOD

(71) Applicant: Advantest Corporation, Tokyo (JP)

(72) Inventor: Kiyotaka Ichiyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/754,917

(22) Filed: Jan. 31, 2013

(65) Prior Publication Data

US 2013/0249625 A1 Sep. 26, 2013

(30) Foreign Application Priority Data

Mar. 21, 2012 (JP) ................. 2012-064103

(51) Int. Cl.
*H03B 21/00* (2006.01)
*H03K 5/00* (2006.01)

(52) U.S. Cl.
USPC ............... 327/113; 327/105; 327/551

(58) Field of Classification Search
USPC ............ 327/551–559, 34, 105–107, 113, 114
See application file for complete search history.

(56) References Cited

U.S. PATENT DOCUMENTS 8,289,032 B2 * 10/2012 Lee et al. ............... 324/613
2007/0019931 A1 * 1/2007 Sirbu ....................... 386/96

FOREIGN PATENT DOCUMENTS

JP 2001-223585 A 8/2001

* cited by examiner

*Primary Examiner* — Dinh T. Le

(57) ABSTRACT

In order to output an accurate waveform in which quantization noise has been cancelled out, provided is a signal generating apparatus that outputs an output signal corresponding to a waveform data sequence expressing a waveform, the signal generating apparatus comprising a DA converting section that outputs an analog signal by sequentially performing digital/analog conversion on each piece of data included in the waveform data sequence, at a timing of a sampling clock; and a jitter injecting section that injects jitter decreasing a quantization noise component of the output signal, into the sampling clock supplied to the DA converting section.

9 Claims, 8 Drawing Sheets

SIGNAL GENERATION APPARATUS AND SIGNAL GENERATION METHOD

BACKGROUND

1. Technical Field

The present invention relates to a signal generating apparatus and a signal generation method.

2. Related Art

Conventionally, a technique is known for cancelling out noise by adding a signal with a phase that is the inverse of the phase of the detected noise. Patent Document 1 describes an apparatus that combines a timing generation apparatus with a plurality of waveform generation apparatuses, to accurately generate a desired waveform.

Patent Document 1: Japanese Patent Application Publication No. 2001-223585

However, conventionally, when a desired waveform is generated by a single DA converter, it is difficult to decrease the noise caused by the quantization error of the DA converter.

SUMMARY

Therefore, it is an object of an aspect of the innovations herein to provide a signal generating apparatus and a signal generation method, which are capable of overcoming the above drawbacks accompanying the related art. The above and other objects can be achieved by combinations described in the claims. According to a first aspect of the present invention, provided is a signal generating apparatus that outputs an output signal corresponding to a waveform data sequence expressing a waveform, the signal generating apparatus comprising a DA converting section that outputs an analog signal by sequentially performing digital/analog conversion on each piece of data included in the waveform data sequence, at a timing of a sampling clock; and a jitter injecting section that injects jitter decreasing a quantization noise component of the output signal, into the sampling clock supplied to the DA converting section.

The summary clause does not necessarily describe all necessary features of the embodiments of the present invention. The present invention may also be a sub-combination of the features described above.

DESCRIPTION OF EXEMPLARY EMBODIMENTS

Hereinafter, an embodiment of the present invention will be described. The embodiment does not limit the invention according to the claims, and all the combinations of the features described in the embodiments are not necessarily essential to means provided by aspects of the invention.

Figure 1:
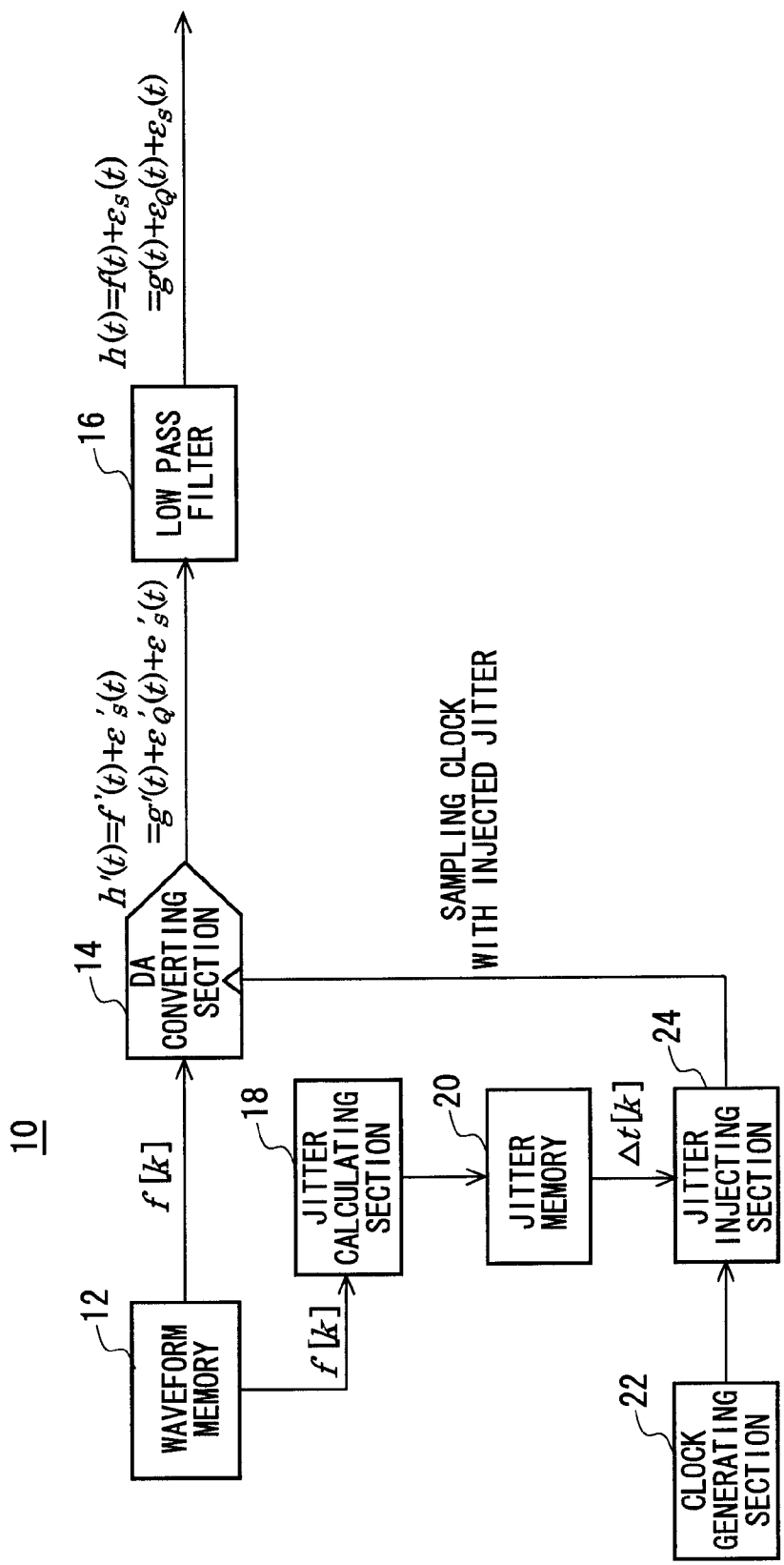
FIG. 1 shows a configuration of the signal generating apparatus 10 according to an embodiment of the present invention.

FIG. 1 shows a configuration of the signal generating apparatus 10 according to an embodiment of the present invention. The signal generating apparatus 10 outputs an analog output signal corresponding to a waveform data sequence expressing a waveform.

The signal generating apparatus 10 includes a waveform memory 12, a DA converting section 14, a low pass filter 16, a jitter calculating section 18, a jitter memory 20, a clock generating section 22, and a jitter injecting section 24. The waveform memory 12 stores a waveform data sequence representing the waveform of an analog signal to be output.

The DA converting section 14 sequentially reads each piece of data included in the waveform data sequence from the waveform memory 12. The DA converting section 14 sequentially performs digital/analog conversion on each piece of data included in the waveform data sequence, at a timing of a sampling clock, and outputs the analog signal.

The low pass filter 16 passes only a low frequency component of the analog signal output from the DA converting section 14. In other words, the low pass filter 16 removes the high-band component of the analog signal output from the DA converting section 14. The signal generating apparatus 10 outputs the signal passed by the low pass filter 16 to the outside, as the output signal.

The jitter calculating section 18 calculates and generates a jitter data sequence that includes data representing jitter to be injected to the sampling clock supplied to the DA converting section 14, based on the characteristics of the low pass filter 16 and the waveform data sequence. More specifically, the jitter calculating section 18 generates a jitter data sequence that includes data expressing jitter for lowering a quantization noise component of the output signal.

For example, the jitter calculating section 18 may generate a jitter data sequence including data expressing jitter that cancels out the quantization noise component caused when the signal obtained by performing digital/analog conversion on the waveform data sequence according to a sampling clock that does not include jitter is passed through the low pass filter 16. In other words, the jitter calculating section 18 may generate a jitter data sequence that includes data expressing jitter that causes a jitter noise component having a phase that is the inverse of the quantization noise component, in the output signal that has been passed through the low pass filter 16.

The jitter memory 20 stores the jitter data sequence generated by the jitter calculating section 18. The clock generating section 22 generates a sampling clock with a predetermined period.

The jitter injecting section 24 sequentially reads each piece of data included in the jitter data sequence from the jitter memory 20. The jitter injecting section 24 injects jitter corresponding to each piece of data included in the jitter data sequence stored in the jitter memory 20, into the sampling clock generated by the clock generating section 22.

For example, the jitter injecting section 24 may delay each pulse of the sampling clock generated in each predetermined period, by an amount corresponding to the data included in the jitter data sequence. In this way, the jitter injecting section 24 can apply jitter with a different delay amount for each pulse of the sampling clock. The jitter injecting section 24 supplies the DA converting section 14 with the sampling clock into which the jitter was injected.

In the signal generating apparatus 10, the digital/analog conversion of each piece of data included in the waveform data sequence by the DA converting section 14 can be performed at the timing of the sampling clock including jitter that reduces the quantization noise component in the output signal. In this way, the signal generating apparatus 10 cancels out the quantization noise component by using the jitter noise component, and can therefore output an analog signal with good accuracy in which the overall noise is reduced.

More specifically, the signal generating apparatus 10 cancels out the quantization noise component by using the jitter noise component in the manner described below.

The output signal of the signal generating apparatus 10, i.e. the signal output from the low pass filter 16, is expressed as $h(t)$. The output signal of the signal generating apparatus 10 is expressed as $f(t)$ in a case where the jitter noise component is zero. The ideal output signal of the signal generating apparatus 10 is expressed as $g(t)$ in a case where the quantization error is zero.

The noise component (jitter noise component) caused by the effect of the jitter of the sampling clock and included in the output signal of the signal generating apparatus 10 is expressed as $\epsilon_S(t)$. The noise component (quantization noise component) caused by the quantization error and included in the output signal of the signal generating apparatus 10 is expressed as $\epsilon_Q(t)$. Here, t is a variable expressing time.

In this case, the output signal $h(t)$ is obtained as the sum of the jitter noise component $\epsilon_S(t)$ and the output signal $f(t)$ in a case where the jitter noise component is zero, as shown in Expression 1 below.

$$h(t)=f(t)+\epsilon_S(t)$$ Expression 1:

The output signal $f(t)$ in a case where the jitter noise component is zero is obtained as the sum of the quantization noise component $\epsilon_Q(t)$ and the ideal output signal $g(t)$ in a case where the quantization error is zero, as shown in Expression 2 below.

$$f(t)=g(t)+\epsilon_Q(t)$$ Expression 2:

Substituting Expression 2 into Expression 1 results in Expression 3 shown below.

$$h(t)=g(t)+\epsilon_Q(t)+\epsilon_S(t)$$ Expression 3:

Based on Expression 3, when $\epsilon_S(t)=-\epsilon_Q(t)$, the output signal $h(t)$ of the signal generating apparatus 10 is the ideal output signal $g(t)$. Accordingly, the signal generating apparatus 10 can output an accurate analog signal with a reduced quantization noise component by injecting, into the sampling clock, jitter that causes in the output signal a jitter noise component $\epsilon_S(t)$ that cancels out the quantization noise component $\epsilon_Q(t)$, i.e. a jitter noise component $\epsilon_S(t)$ with an inverse phase relative to the quantization noise component $\epsilon_Q(t)$.

Figure 2:
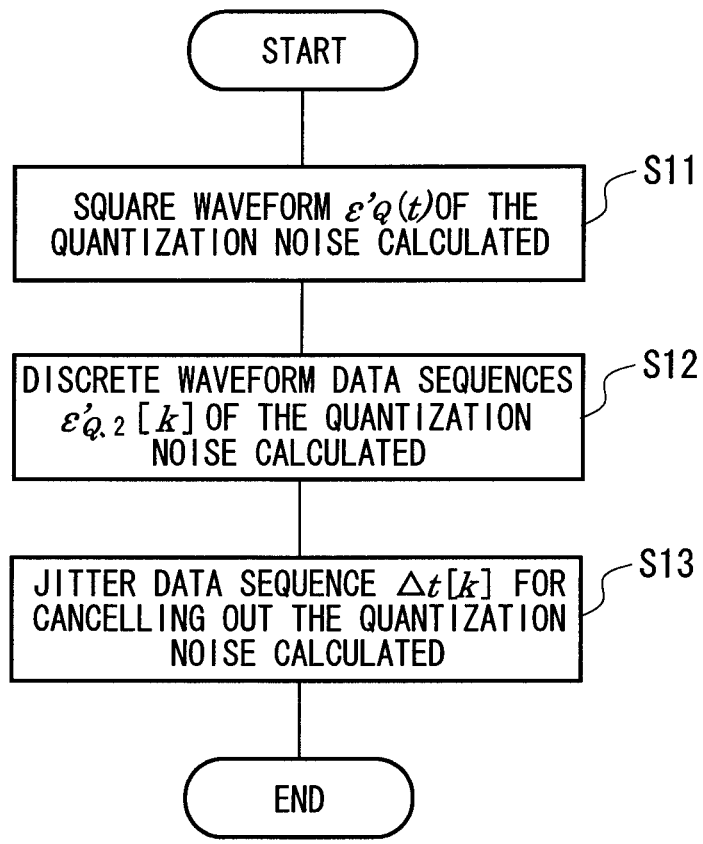
FIG. 2 shows an exemplary process flow for generating the jitter data sequence.

FIG. 2 shows an exemplary process flow for generating the jitter data sequence performed by the jitter calculating section 18. The jitter calculating section 18 performs the process from step S11 to step S13, shown below, on the waveform data sequence f[k] stored in the waveform memory 12, to generate the jitter data sequence Δt[k] expressing the jitter to be injected into the sampling clock. Here, k is a variable representing a sample number (integer) of the sampling clock.

Prior to the generation of the output signal by the signal generating apparatus 10, the jitter calculating section 18 performs the processes from step S11 to step S13. In this way, prior to generating the output signal, the signal generating apparatus 10 can store the jitter data sequence Δt[k] in the jitter memory 20 in advance. Instead, the jitter calculating section 18 may repeatedly perform the processes from step S11 to step S13 in real time and in parallel with the processes for generating the output signal.

First, at step S11, the jitter calculating section 18 calculates a square waveform $\epsilon'_Q(t)$ of the quantization noise. Here, the square waveform $\epsilon'_Q(t)$ of the quantization noise is a waveform expressing the quantization noise included in the analog signal output from the DA converting section 14, i.e. in the analog signal prior to being input to the low pass filter 16.

A waveform data sequence of M bits (where M is an integer greater than 1) on which the DA converting section 14 performs analog/digital conversion is expressed as f[k]. The ideal waveform data sequence, which is the waveform output from the signal generating apparatus 10 expressed with M bits or more, is g[k].

Figure 3:
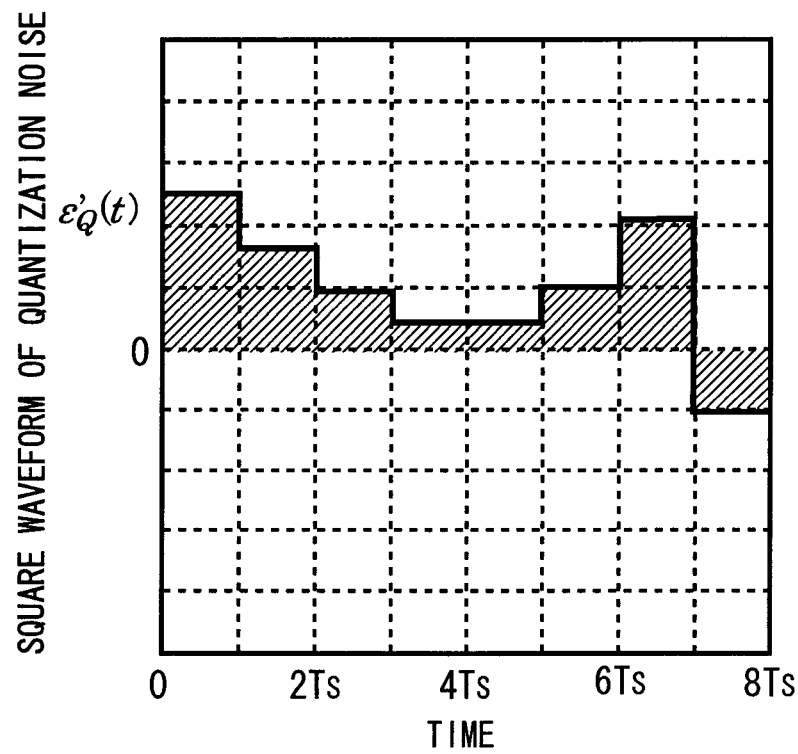
FIG. 3 shows an exemplary square waveform $\epsilon'_Q(t)$ of the quantization noise.

In this case, the jitter calculating section 18 calculates the quantization noise data sequence $\epsilon_Q[k]$ by subtracting the data corresponding to the waveform data sequence f[k] from each piece of data in the ideal waveform data sequence g[k], for each sample number (k). The jitter calculating section 18 sets the square waveform $\epsilon'_Q(t)$ of the quantization noise to be the square waveform corresponding to each piece of data in this quantization noise data sequence $\epsilon_Q[k]$. The square waveform $\epsilon'_Q(t)$ of the quantization noise generated in this way is a stepped waveform in which the level changes at the timing of the sampling clock as shown in FIG. 3, for example.

The waveform memory 12 may store an ideal waveform data sequence g[k] with a resolution greater than M bits. In this case, the DA converting section 14 may read, as the waveform data sequence f[k], the upper M bits of data included in the ideal waveform data sequence g[k] and perform the digital/analog conversion on this data, for example. Furthermore, in this case, the jitter calculating section 18 may read the data that is lower than the M bits included in the ideal waveform data sequence g[k] as the quantization noise data sequence $\epsilon_Q[k]$.

Next, at step S12, the jitter calculating section 18 calculates a discrete waveform data sequence $\epsilon_{Q,2}[k]$ of the quantization noise. The discrete waveform data sequence $\epsilon_{Q,2}[k]$ of the quantization noise is obtained by re-sampling, with the sampling clock, the quantization noise component included in the output signal of the signal generating apparatus 10.

At step S12, first, the jitter calculating section 18 calculates the waveform $\epsilon_Q(t)$ obtained by passing the square waveform $\epsilon'_Q(t)$ of the quantization noise calculated at step S11 through the low pass filter 16. For example, the jitter calculating section 18 may calculate the waveform $\epsilon_Q(t)$ as the convolution of the square waveform $\epsilon'_Q(t)$ of the quantization noise and the time response function of the low pass filter 16. As another example, the jitter calculating section 18 may calculate the waveform $\epsilon_Q(t)$ by performing a Fourier transform on the square waveform $\epsilon'_Q(t)$ of the quantization noise, multiplying the result by the frequency response function of the low pass filter 16 in the frequency domain, and performing an inverse Fourier transform on the result of this multiplication.

Figure 4:
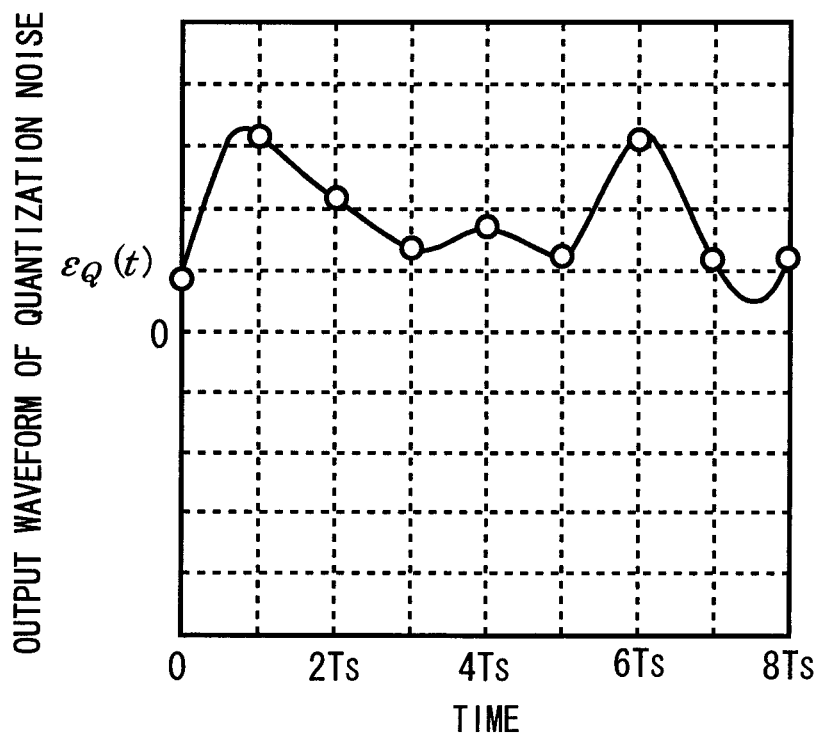
FIG. 4 shows an exemplary output waveform $\epsilon_Q(t)$ of the quantization noise.

The waveform $\epsilon_Q(t)$ obtained by passing the square waveform $\epsilon'_Q(t)$ of the quantization noise through the low pass filter 16 is a waveform having a smooth connection between two sampling clocks, as shown in FIG. 4, for example. The jitter calculating section 18 generates the discrete waveform data sequence $\epsilon_{Q,2}[k]$ of the quantization noise by sampling, at each timing of the sampling clock, the waveform $\epsilon_Q(t)$ obtained by passing the square waveform $\epsilon'_Q(t)$ of the quantization noise through the low pass filter 16.

Next, at step S13, the jitter calculating section 18 calculates the jitter data sequence Δt[k] for generating the jitter that cancels out the quantization noise, based on the function representing the discrete waveform data sequence $\epsilon_S[k]$ of the jitter noise and the discrete waveform data sequence $\epsilon_{Q,2}[k]$ of the quantization noise calculated at step S12.

Here, the function expressing the discrete waveform data sequence $\epsilon_S[k]$ of the jitter noise is expressed as shown below.

Figure 5:
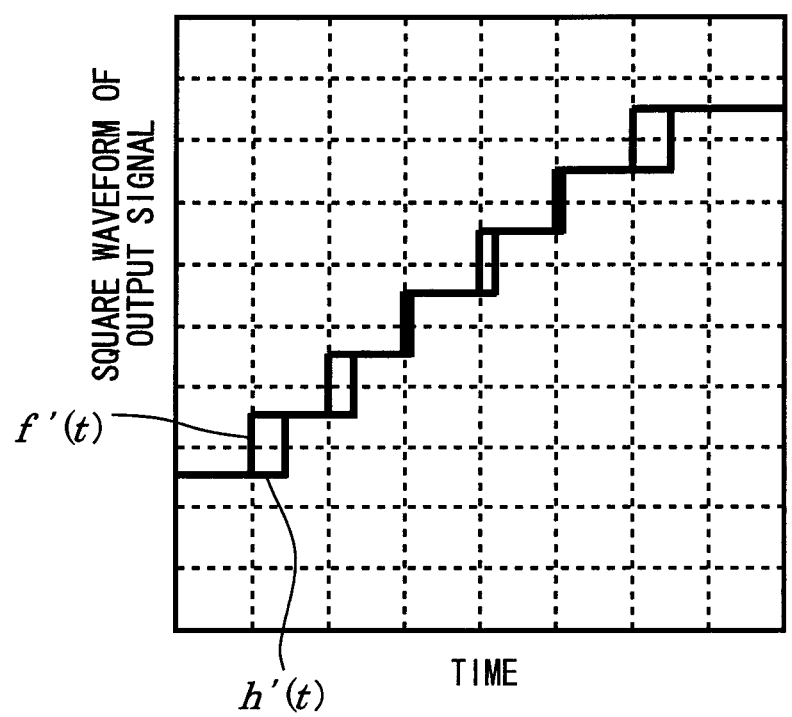
FIG. 5 shows an exemplary square waveform f'(t) of the output signal that does not include jitter and an exemplary square waveform h'(t) of the output signal that does include jitter.
Figure 6:
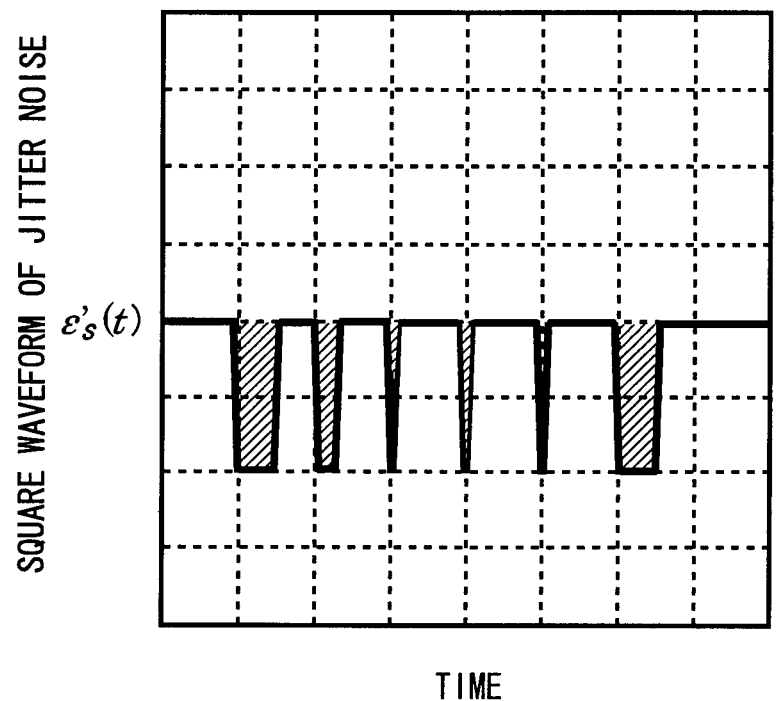
FIG. 6 shows an exemplary square waveform $\epsilon'_S(t)$ of the jitter noise.

First, the square waveform $\epsilon'_S(t)$ of the jitter noise included in the analog signal output from the DA converting section 14 is obtained by subtracting the waveform h'(t) of the analog signal output from the DA converting section 14 in a case where the jitter noise component is included from the waveform f'(t) of the analog signal output from the DA converting section 14 in a case where the jitter noise component is zero, as shown in FIG. 5, for example. Accordingly, the square waveform $\epsilon'_S(t)$ of the jitter noise is a waveform in which the pulses emitted discretely are connected in the time direction, such as shown in FIG. 6, for example.

Figure 7:
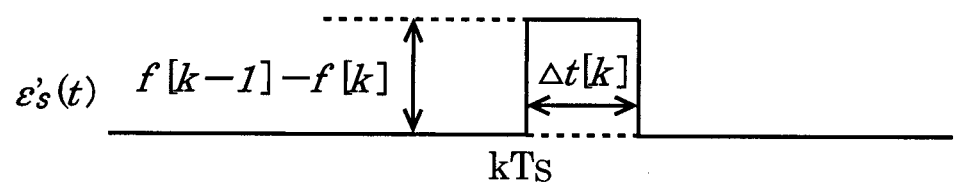
FIG. 7 sows exemplary amplitude and pulse width of the square waveform $\epsilon'_S(t)$ of the jitter noise.

In this square waveform $\epsilon'_S(t)$ of the jitter noise, the amplitude of each pulse expresses a change amount (f[k−1]-f[k]) of the waveform f'(t) of the analog signal output from the DA converting section 14, as shown in FIG. 7. Furthermore, in the square waveform $\epsilon'_S(t)$ of the jitter noise, the width of each pulse represents the jitter (Δt[k]) of the waveform h'(t) of the analog signal output from the DA converting section 14.

The jitter noise component $\epsilon_S(t)$ included in the output signal of the low pass filter 16 is a waveform occurring after the square waveform $\epsilon'_S(t)$ of the jitter noise has passed through the low pass filter 16. In other words, the jitter noise component $\epsilon_S(t)$ is obtained as the convolution of the square waveform $\epsilon'_S(t)$ of the jitter noise and the time response function of the low pass filter 16.

Based on this, the jitter noise component $\epsilon_S(t)$ is expressed as shown below in Expression 4. Here, m indicates a given sample number (integer) of the sampling clock, a(t) indicates the time response function of the low pass filter 16, Ts indicates the period of the sampling clock, and τ is a variable indicating the parallel movement amount for the convolution.

$$\varepsilon_S(t) = \sum_{m=0}^{\infty} \{f[m-1] - f[m]\} \int_{mT_S}^{mT_S + \Delta t[m]} a(t - \tau) d\tau \quad (4)$$

In other words, the jitter noise component $\epsilon_S(t)$ is a value obtained as the cumulative value (total sum) of the values obtained as the convolutions between the pulse waveform corresponding to the m-th sampling clock and the time response function a(t) of the low pass filter 16 of a range of values from m=0 to m=∞ (maximum value within the computation range).

Here, when τ'=t−τ, Expression 4 is transformed into Expression 5 shown below.

$$\varepsilon_S(t) = -\sum_{m=0}^{\infty} \{f[m-1] - f[m]\} \int_{t-mT_S}^{t-mT_S - \Delta t[m]} a(\tau') d\tau' \quad (5)$$

The discrete waveform data sequence $\epsilon_S[k]$ of the jitter noise is the jitter noise component $\epsilon_S(t)$ in a case where t=k·Ts (k=0, 1, 2, 3, ...). Accordingly, the discrete waveform data sequence $\epsilon_S[k]$ is as shown below in Expression 6.

$$\varepsilon_S[k] = -\sum_{m=0}^{\infty} \{f[m-1] - f[m]\} \int_{[k-m]T_S}^{[k-m]T_S - \Delta t[m]} a(\tau') d\tau' \quad (6)$$

At each sampling timing (k), conditions such as shown in Expression 7 below should be fulfilled in order to cancel out the quantization noise component with the jitter noise component.

$$\varepsilon_S[k] = -\sum_{m=0}^{\infty} \{f[m-1] - f[m]\} \int_{[k-m]T_S}^{[k-m]T_S - \Delta t[m]} a(\tau') d\tau' = -\varepsilon_{Q,2}[k] \quad (7)$$

Accordingly, the jitter calculating section 18 calculates the jitter Δt[k] that fulfills the conditions of Expression 7, for each sampling timing (k). In this way, at step S13, the jitter calculating section 18 can calculate the jitter data sequence Δt[k] causing jitter that cancels out the quantization noise, based on the function expressing the discrete waveform data sequence $\epsilon_S[k]$ of the jitter noise and the discrete waveform data sequence $\epsilon_{Q,2}[k]$ of the quantization noise calculated at step S12.

The signal generating apparatus 10 can output a signal with little quantization noise by performing a DA conversion on the waveform data sequence according to a sampling clock into which is injected jitter corresponding to the jitter data sequence Δt[k] calculated in the manner described above. In this way, the signal generating apparatus 10 can output a signal with little quantization noise by using the DA converting section 14 with low resolution. As a result, the signal generating apparatus 10 can output a signal with the desired accuracy at high speed.

The jitter calculating section 18 may calculate the jitter data sequence by using the jitter noise component and the quantization noise component corresponding to the response characteristics of a filter model that approximates the low pass filter 16. The filter model approximating the low pass filter 16 may be a filter model of a low pass filter having a cutoff frequency that is substantially the same as that of the low pass filter 16, for example. More specifically, the filter model approximating the low pass filter 16 may be a square wave filter with a cutoff frequency that is substantially the same as that of the low pass filter 16.

In this way, the jitter calculating section 18 can decrease the amount of computation for calculating the jitter data sequence, by using the response characteristics of a filter model approximating the low pass filter 16. The jitter calculating section 18 can more accurately approximate the low pass filter 16 by increasing the amount of computation for calculating the jitter data sequence, and can therefore calculate the jitter data sequence causing the jitter that accurately cancels out the quantization noise. On the other hand, the signal generating apparatus 10 can calculate the jitter data sequence more quickly by decreasing the amount of computation for calculating the jitter data sequence.

If signals with the same level are output in series, even when jitter is included in the sampling clock, there is no jitter noise component included in the output signal. Accordingly, when a signal is output having the same level as the signal output at the immediately prior sampling clock timing, the jitter injecting section 24 may inject a predetermined jitter. In this way, the jitter calculating section 18 can decrease the amount of computation for calculating the jitter data sequence in a case where signals with the same level are output in series.

Figure 8:
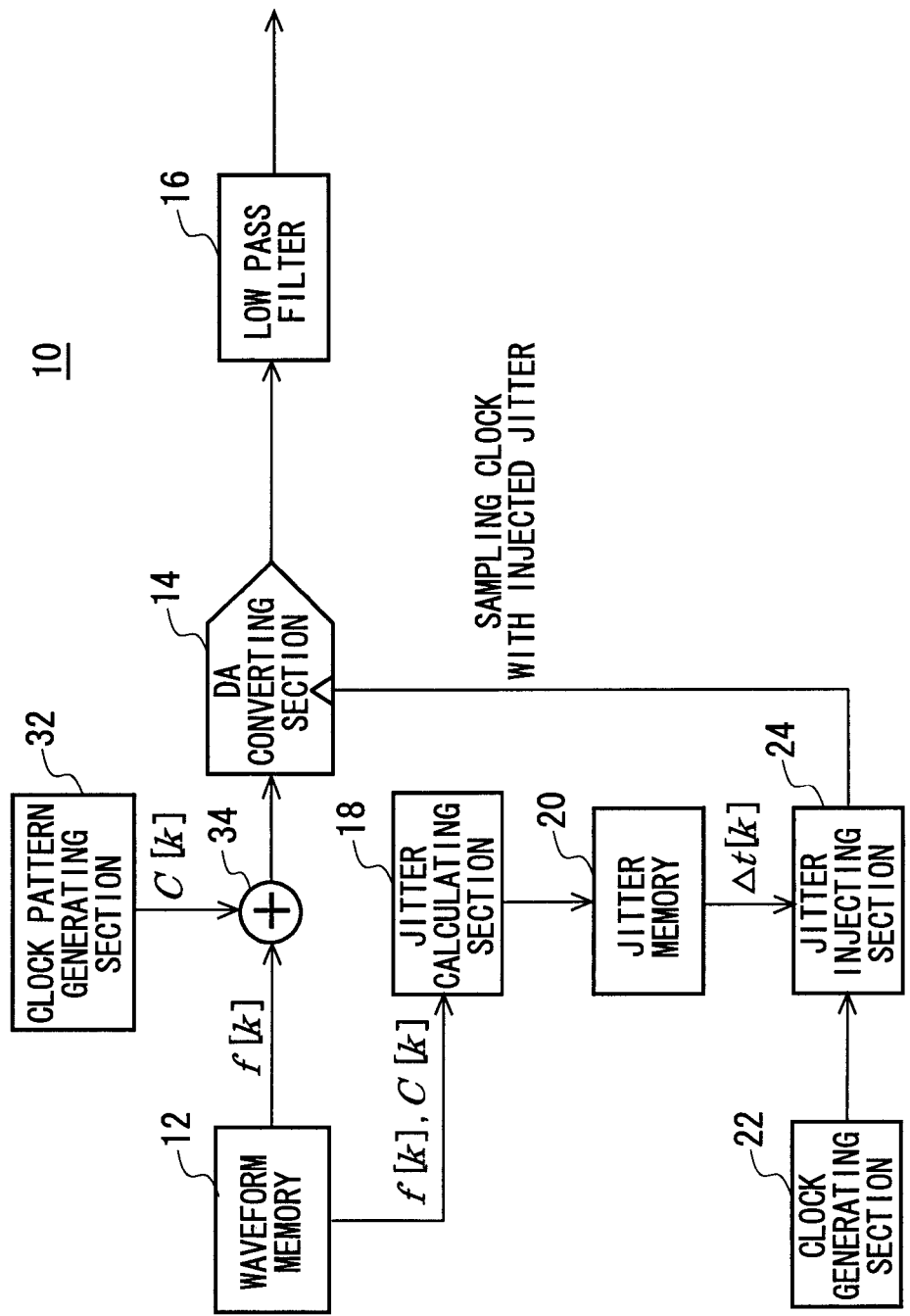
FIG. 8 shows a configuration of a signal generating apparatus 10 according to a first modification of the present invention.

FIG. 8 shows a configuration of a signal generating apparatus 10 according to a first modification of the present embodiment. In the signal generating apparatus 10 of the present modification, components having the same reference numerals as components in FIG. 1 adopt substantially the same function and configuration, and the following description includes only differing points.

The signal generating apparatus 10 according to the present modification further includes a clock pattern generating section 32 and an adding section 34. The clock pattern generating section 32 outputs clock pattern data generating a waveform whose level changes according to the period of the sampling clock. For example, the clock pattern generating section 32 sequentially generates data (e.g. a pattern of . . . 1, −1, 1, −1, 1, . . . ) expressing a waveform in which the level is centered on the DC level and inverts according to the period of the sampling clock.

The adding section 34 sequentially reads each piece of data included in the waveform data sequence from the waveform memory 12, for each sampling clock. The adding section 34 adds the clock pattern data generated by the clock pattern generating section 32 to each piece of data included in the waveform data sequence. The DA converting section 14 performs digital/analog conversion on the data obtained as the sum of each piece of data included in the waveform data sequence and the clock pattern data.

The jitter calculating section 18 generates the jitter data sequence including the data that expresses the jitter for cancelling out the quantization noise of the output signal caused by the digital/analog conversion performed on each piece of data in the waveform data sequence to which the clock pattern data has been added. The jitter injecting section 24 injects, into the sampling clock, jitter that cancels out the quantization noise of the output signal caused by the digital/analog conversion performed on each piece of data in the waveform data sequence to which the clock pattern data has been added.

This signal generating apparatus 10 can cancel out the quantization noise component by injecting jitter into the sampling clock, even when signals with the same level are output in series. In the signal generating apparatus 10, the fluctuation component of the output signal due to the clock pattern data appears as an integer multiple of the Nyquist frequency, and is therefore cut off by the low pass filter 16 and does not affect the output signal.

Figure 9:
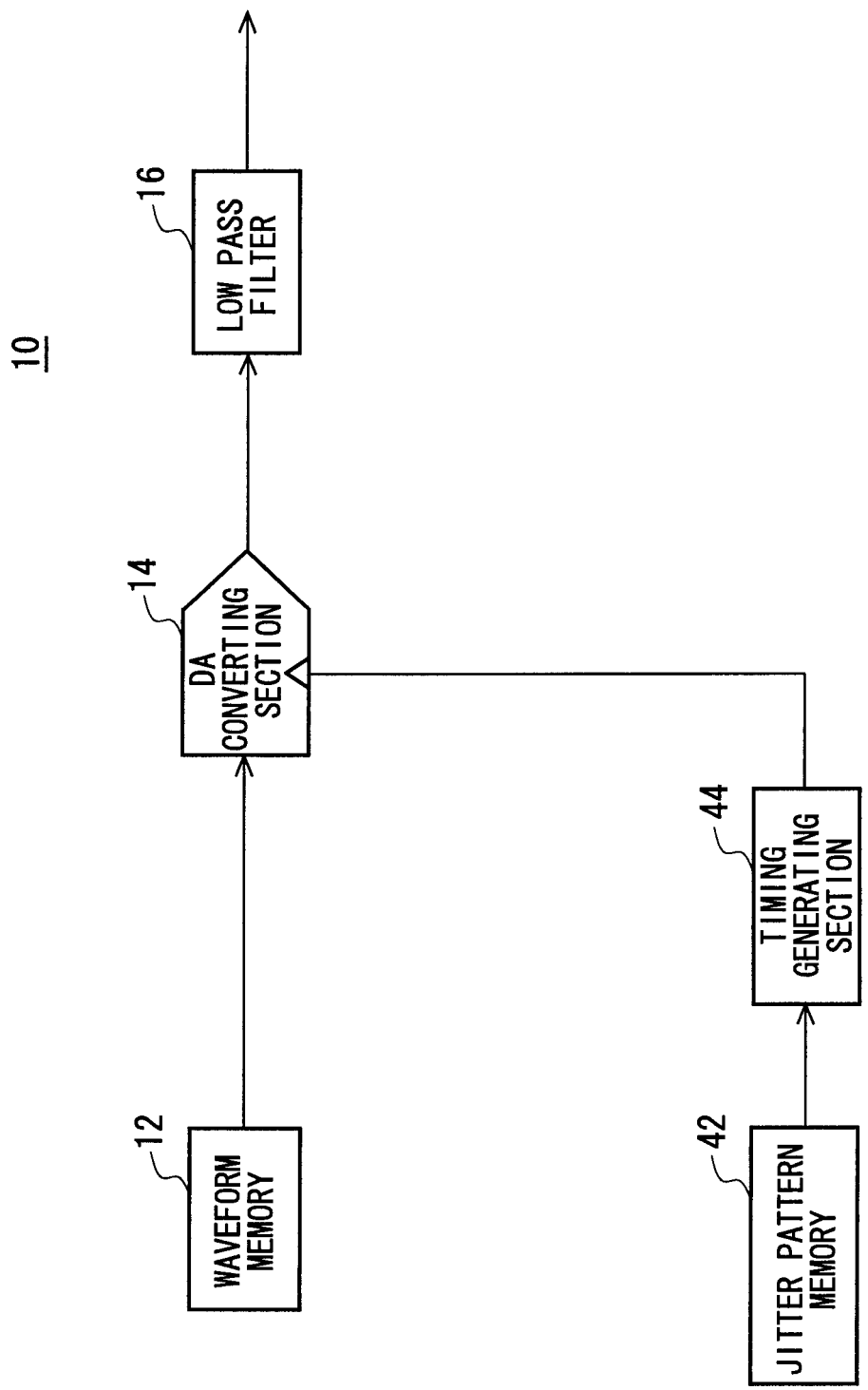
FIG. 9 shows a configuration of a signal generating apparatus 10 according to a second modification of the present invention.

FIG. 9 shows a configuration of a signal generating apparatus 10 according to a second modification of the present embodiment. In the signal generating apparatus 10 of the present modification, components having the same reference numerals as components in FIG. 1 adopt substantially the same function and configuration, and the following description includes only differing points.

The signal generating apparatus 10 of the present modification includes the waveform memory 12, the DA converting section 14, the low pass filter 16, a jitter pattern memory 42, and a timing generating section 44. In other words, the signal generating apparatus 10 includes the jitter pattern memory 42 and the timing generating section 44 in place of the jitter calculating section 18, the jitter memory 20, the clock generating section 22, and the jitter injecting section 24.

The jitter pattern memory 42 generates a data pattern for outputting a sampling clock including jitter. The timing generating section 44 generates a signal with a waveform corresponding to the data pattern generated by the jitter pattern memory 42. In other words, the timing generating section 44 generates a sampling clock corresponding to the clock pattern generated by the jitter pattern memory 42. The timing generating section 44 supplies the DA converting section 14 with the generated sampling clock. The DA converting section 14 performs digital/analog conversion on each piece of data included in the waveform data stored in the waveform memory 12, at the timing of the sampling clock supplied from the timing generating section 44.

Here, the jitter pattern memory 42 generates the data pattern for outputting the sampling clock that includes jitter for decreasing the quantization noise component of the output signal. More specifically, the jitter pattern memory 42 generates a data pattern for outputting a sampling clock that is the same as that of the jitter injecting section 24 shown in FIG. 1.

In this way, with the signal generating apparatus 10 of the present modification, the DA converting section 14 can perform analog/digital conversion on each piece of data included in the waveform data sequence, at a timing of the sampling clock that includes the jitter for decreasing the quantization noise component of the output signal. As a result, the signal generating apparatus 10 can cancel out the quantization noise component using the jitter noise component, and can output an accurate analog signal with reduced noise.

While the embodiments of the present invention has have been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal generating apparatus that outputs an output signal corresponding to a waveform data sequence expressing a waveform, the signal generating apparatus comprising:
   a DA converting section that outputs an analog signal by sequentially performing digital/analog conversion on each piece of data included in the waveform data sequence, at a timing of a sampling clock;
   a jitter injecting section that injects jitter decreasing a quantization noise component of the output signal, into the sampling clock supplied to the DA converting section; and
   a waveform memory that stores the waveform data sequence, wherein
   the DA converting section reads each piece of data included in the waveform data sequence from the waveform memory.

2. The signal generating apparatus according to claim 1, wherein
   the DA converting section outputs the analog signal through a low pass filter, and
   the jitter injecting section injects the sampling clock with the jitter cancelling out the quantization noise component occurring when a signal, obtained as the result of digital/analog conversion performed on the waveform data sequence according to the sampling clock that does not include jitter, is passed through the low pass filter.

3. The signal generating apparatus according to claim 2, wherein
the jitter injecting section injects the sampling clock with jitter that causes, in the output signal that has passed through the low pass filter, a jitter noise component having a phase that is inverse of a phase of the quantization noise component.

4. The signal generating apparatus according to claim 3, further comprising a jitter calculating section that calculates and generates a jitter data sequence including data that expresses jitter to be injected into the sampling clock.

5. The signal generating apparatus according to claim 4, wherein
the jitter calculating section calculates the jitter data sequence by using the jitter noise component and the quantization noise component corresponding to a response characteristic of a filter model approximating the low pass filter.

6. The signal generating apparatus according to claim 1, wherein
in a case where a signal is output having the same level as a signal output at an immediately prior sampling clock, the jitter injecting section injects jitter with a predetermined value.

7. The signal generating apparatus according to claim 1, further comprising an adding section that adds, to each piece of data included in the waveform data sequence, clock pattern data generating a waveform whose level changes according to a period of the sampling clock, wherein the DA converting section performs digital/analog conversion on data obtained as a sum of each piece of data included in the waveform data sequence and the clock pattern data, and
the jitter injecting section injects the sampling clock with jitter cancelling out the quantization noise component of the output signal caused by the digital/analog conversion performed on each piece of data in the waveform data sequence to which the clock pattern data has been added.

8. The signal generating apparatus according to claim 1, further comprising a jitter memory that stores a jitter data sequence expressing jitter to be injected into the sampling clock, wherein
the jitter injecting section generates a sampling clock injected with jitter corresponding to each piece of data included in the jitter data sequence, and supplies the resulting sampling clock to the DA converting section.

9. A signal generation method for outputting an output signal corresponding to a waveform data sequence expressing a waveform, the method comprising:
storing the waveform data sequence in a waveform memory;
reading, by a DA converting section, each piece of data included in the waveform data sequence from the waveform memory;
outputting, by the DA converting section, an analog signal by sequentially performing digital/analog conversion on each piece of data included in the waveform data sequence, at a timing of a sampling clock; and
injecting jitter that decreases a quantization noise component of the output signal, into the sampling clock supplied to the DA converting section.

* * * * *